United States Patent [19]

Botez

[11] 4,385,389
[45] May 24, 1983

[54] PHASE-LOCKED CDH-LOC INJECTION LASER ARRAY

[75] Inventor: Dan Botez, Mt Holly, N.J.

[73] Assignee: RCA Corporation, New York, N.Y.

[21] Appl. No.: 274,245

[22] Filed: Jun. 16, 1981

Related U.S. Application Data

[63] Continuation-in-part of Ser. No. 168,045, Jul. 14, 1980, abandoned.

[51] Int. Cl.³ .............................................. H01S 3/19
[52] U.S. Cl. ........................................ 372/48; 372/50
[58] Field of Search ...................... 372/45, 46, 48, 50; 357/17

[56] References Cited

U.S. PATENT DOCUMENTS

| | | | |
|---|---|---|---|
| 4,092,659 | 5/1978 | Ettenberg | 372/49 |
| 4,215,319 | 7/1980 | Botez | 372/46 |
| 4,255,717 | 3/1981 | Scifres et al. | 372/50 |

OTHER PUBLICATIONS

Scifres et al., "High-Power Coupled-Multiple-Strip Phased-Locked Injection Laser", APL, 34(4) Feb. 15, 1979 pp. 259-261.

Laff et al., "Thermal Performance and Limitations of Silicon-Substrate Packaged GaAs Laser Arrays", Applied Optics, vol. 17 No. 5, Mar. 1, 1978, pp. 778-784.

Scifres et al., "Phase-Locked Semiconductor Laser Array", Appl. Phys. Lett. 33(2), Dec. 15, 1978, pp 1015-1017.

Tsang et al., "A Densely Packed Monolithic Linear Array of GaAs-Al$_x$Ga$_{1-x}$As Strip Buried Heterostructure Laser," Appl. Phys. Lett. 34(2) Jan. 15, 1979, pp. 162-165.

*Primary Examiner*—James W. Davie
*Attorney, Agent, or Firm*—Birgit E. Morris; Donald S. Cohen

[57] ABSTRACT

The invention is a phase-locked array of CDH-LOC semiconductor injection lasers which has a single, coherent continuous wave output beam. Coupling between elements of the array can occur over long distances because the radiated light wave propagates primarily in the transparent guide layer of the array structure. The elements of the array are then thermally isolated from one another so that continuous wave operation can occur.

11 Claims, 2 Drawing Figures

PHASE-LOCKED CDH-LOC INJECTION LASER ARRAY

The U.S. Government has rights in this invention pursuant to a government contract.

This application is a continuation-in-part of my application Ser. No. 168,045 filed July 14, 1980 abandoned.

The invention relates to a phase-locked array of CDH-LOC semiconductor injection lasers which exhibits an intercoupling of the elements of the array resulting in a single, coherent continuous wave output beam.

BACKGROUND OF THE INVENTION

A semiconductor injection laser typically comprises a body of semiconductor material, generally Group III-V compounds or alloys of such compounds, having a thin active region between regions of opposite conductivity type, that is, i.e., a region of p-type conductivity on one side of the active region and a region of n-type conductivity on the other side of the active region. Botez, in U.S. Pat. No. 4,215,319 issued July 29, 1980 and incorporated herein by reference, has disclosed a laser, called a CDH laser, which emits a stable, single optical mode filament. The laser comprises a body of semiconductor material having a substrate with a pair of spaced substantially parallel dovetail shaped grooves in the surface of the substrate. A first confining epitaxial layer is over the surface of the substrate and the surfaces of the grooves. An active layer is over the first epitaxial layer. The active layer has a portion of uniform thickness over the portion of the surface of the substrate which is between the grooves and tapers away in thickness in either direction from the grooves. A second confining layer is over the active layer. The first and second confining layers are of opposite conductivity types. The active layer is the recombination region of the laser with the light beam being generated in the portion between the grooves. The index of refraction of the active region is greater than that of the first and second confining regions. This laser is limited, however, in its output power by the small cross-sectional area of the lasing filament.

Botez, in U.S. patent application Ser. No. 251,651, filed Apr. 6, 1981 which is a continuation-in-part of U.S. patent application Ser. No. 084,387, filed Oct. 12, 1979 and incorporated herein by reference, has disclosed a semiconductor laser, called a CDH-LOC laser, which provides a stable, single optical mode filament of light of large cross-sectional area. This injection laser comprises a CDH laser having a guide layer interposed between the first confinement layer and the active layer and which is of the same conductivity type as the first confinement layer. The guide layer is of a material having an index of refraction less than that of the active layer but larger than that of each of either the first or second confinement layers. The light beam generated in the active region then propagates both in the thin active region and the relatively thicker guide layer thereby forming a lasing filament having a significantly larger cross-sectional area. While the CDH-LOC laser disclosed by Botez produces a single optical mode filament of light of significantly greater power than that of the CDH laser, the power output in this mode is still limited.

The approach to increasing the output power in planar striped oxide lasers while retaining the coherency of the light of the output light beam has been to construct an array of closely spaced individual lasers which are phase-locked with one another so that the output of each of the lasers is coherent with that of the others and the array behaves as a single light source. Such an array has been disclosed by Scifres et al. in Applied Physics Letters 34, 259 (1979). A problem with this approach is that the close spacing between the elements of the array, which is required because of the high absorption of the light wave in the active layer and by the limited spatial extent of the optical mode in the plane of the junction in prior art planar striped oxide lasers, produces excessive electrical heating of the array when excited. This heating degrades the performance of the array. As a result, the phase-locked array can only be operated in a pulsed mode at a low duty cycle where heating is minimized. If the elements of the array are spaced far enough apart so that electrical heating of the array does not occur to the extent that it degrades the performance of the array, then the phase-locked nature of the output is lost since the elements are too far apart for optical coupling between elements to occur.

SUMMARY OF THE INVENTION

A phase-locked semiconductor injection array comprises a body of semiconductor material having a substrate with a plurality of separate pairs of spaced, substantially parallel grooves in the surface of the substrate. A first confinement epitaxial layer overlies the surface of the substrate and the surfaces of the grooves. A guide epitaxial layer overlies the first confinement layer. A thin active epitaxial layer overlies the guide layer and a second confinement epitaxial layer overlies the active layer. The substrate, the first confinement layer and the guide layer are of one conductivity type and the second confinement layer is of the opposite conductivity type. The material of the active layer has an index of refraction greater than that of the materials of the first and second confinement layers and the material of the guide layer has an index of refraction less than that of the material of the active layer but greater than that of the material of each of the first and second confinement layers. The region above each pair of grooves constitutes an element of the array. The active layer is the recombination region of an element of the array with the light generated therein in the vicinity of the portion of the active layer which is over the surface portion between the two grooves of a pair. Light generated in the recombination region propagates partially in the transparent guide layer such that the light generated in different elements of the array can couple to one another over long distances and are phase-locked, thereby forming a single coherent output light beam from all of the elements of the array.

DETAILED DESCRIPTION OF THE INVENTION

Figure 1:
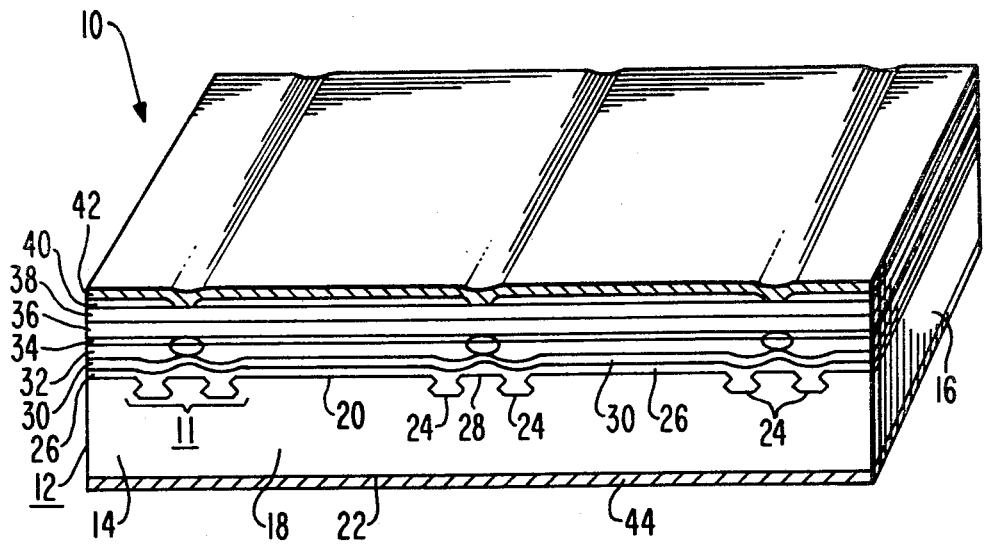
FIG. 1 is a schematic illustration of a phase-locked semiconductor injection laser array.
Figure 2:
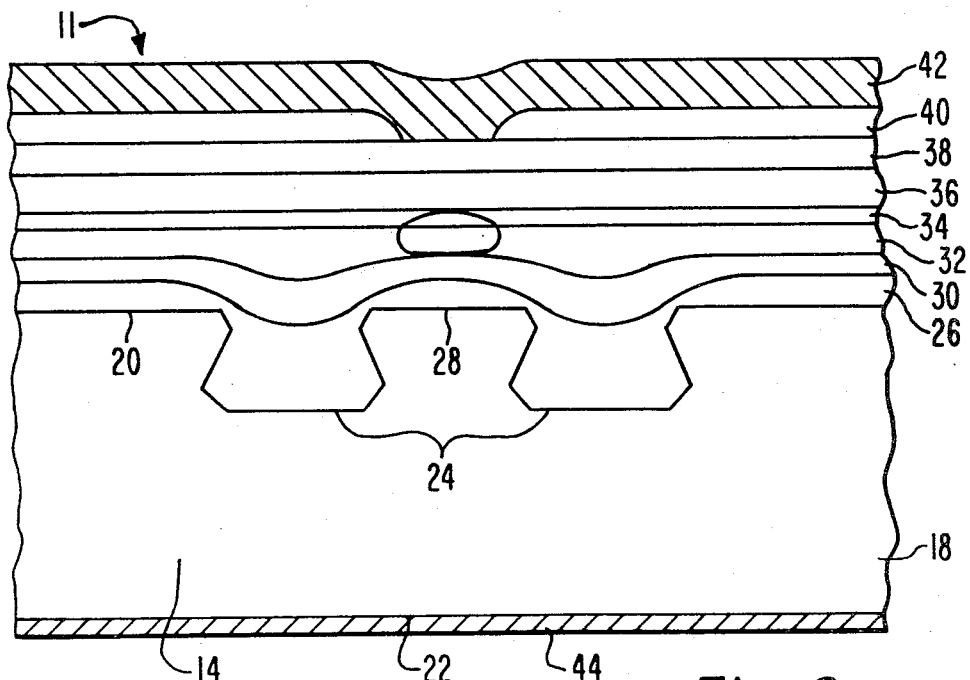
FIG. 2 is a schematic illustration of a cross-sectional view of one element of a phase-locked semiconductor injection laser array of FIG. 1.

Referring to FIGS. 1 and 2, the identification of the elements of the phase-locked injection laser array 10 and the individual element 11 of the array 10 of FIG. 2 are the same. The injection laser array 10 comprises a body 12 of single crystalline semiconductor material, generally of the Group III-V compounds or alloys of such compounds, which has spaced parallel end surfaces 14 which are reflecting to light at the laser wavelength with at least one of the end surfaces being partially transparent so that light may be emitted therefrom. The body 12 also includes spaced, substantially parallel side surfaces 16 which extend between and are perpendicular to the end surfaces 14.

The body 12 is formed by a substrate 18 having spaced, parallel top and bottom surfaces 20 and 22, respectively, which extend between and are perpendicular to both the end surfaces 14 and side surfaces 16 of the body 12. In the top surface 20 of the substrate 18, are a plurality of pairs of spaced, parallel dovetail shaped grooves 24 which extend between the end surfaces 14 of the body 12. Three elements 11 of the array, each comprised of a pair of dovetail shaped grooves 24 and the regions of the layers above the grooves, are shown in FIG. 1. It is to be understood that the array is not limited to three elements.

Preferably, a buffer epitaxial layer 26 partially fills each of the grooves 24 and extends over the portion 28 of the surface 20 between the grooves 24 and the portions of the surface 20 on each side of the grooves 24 between the elements 11 of the array. A first confinement epitaxial layer 30 extends over the buffer layer 26 and has a portion of relatively uniform thickness over the substrate surface portion 28 between the grooves 24 for each element of the array. A guide epitaxial layer 32 overlies the first confinement layer 30. The substrate 18, the buffer epitaxial layer 26, the first confinement layer 30 and the guide layer 32 are of the same conductivity type. An active epitaxial layer 34 overlies the first confinement layer 32. The active layer 34 is thin and has a portion of uniform thickness directly over the portion of uniform thickness of the first confinement layer 30. The active layer 34 is the recombination region of the element 11 of the array. Although the active layer 34 can be of either conductivity type, it is preferably of a material which is not intentionally doped.

A second confinement epitaxial layer 36 overlies the active layer 34 and is of a conductivity type opposite to that of the first confinement and guide layers 30 and 32, respectively. A cap epitaxial layer 38 of the same conductivity type as the second confinement layer 36 overlies the second confinement layer 36.

An electrically insulating layer 40 of a material such as silicon dioxide or aluminum oxide overlies the cap layer 38 and has an opening therethrough in the form of a stripe extending above the flat substrate portion 28 for each of the elements 11 of the array. An electrically conducting contact 42 overlies the electrically insulating layer 40 and extends into the openings in the insulating layer 40 to contact the surface of the cap layer 38. A sheet electrical contact 44 overlies the surface 22 of the substrate 18 forming a common electrical contact to this surface of the substrate.

The injection laser array of the invention may be formed of materials such as gallium arsenide and aluminum gallium arsenide which have the requisite lattice match and index of refraction differences and may be grown using techniques such as those described by Botez in U.S. patent application Ser. No. 215,651 referred to above.

The substrate 18 is preferably of n-type gallium arsenide having a top surface 20 which is parallel to the (100) crystallographic plane. The substrate may be misoriented from this orientation but preferably a (100) plane is used. The grooves 24 are formed in the surface 20 of the substrate 18 using standard photolithographic techniques and a preferential etch. The grooves are typically 4 to 5 microns deep having an opening at the surface 28 about 8 to 12 microns in width with a typical center-to-center spacing between grooves of an element 11 of the array of about 32 microns. The center-to-center spacing of the elements of the array need only be greater than the groove spacing and can vary between about 20 micrometers and 200 micrometers and is preferably between about 50 micrometers and about 100 micrometers.

The buffer layer is comprised of n-type GaAs. The first confinement layer is composed of n-type $Al_xGa_{1-x}As$ where the fractional concentration x of aluminum is between about 0.25 and 0.4 and is typically about 0.30. The guide layer is composed of n-type $Al_yGa_{1-y}As$ where the fractional concentration y of aluminum is between about 0.13 and about 0.25 and is typically about 0.20. The thickness of this layer is typically between about 0.5 and about 2.0 micrometers. The active layer is composed of $Al_zGa_{1-z}As$ where the fractional concentration z of aluminum is between about 0.0 and about 0.1. This layer is preferably undoped and is typically about 0.1 to about 0.4 micrometer thick. The second confining layer is composed of p-type conductivity $Al_rGa_{1-r}As$ where the fractional concentration r of aluminum varies between about 0.3 and 0.4 and is typically between about 0.3 and about 0.35.

The cap layer is composed of p-type GaAs and is present so that the electrical contact to the array is simplified. Alternatively, a layer of n-type GaAs may overlie the second confinement layer. A zinc dopant is then diffused through the cap layer to the second confining layer in the regions beneath the openings in the electrically insulating layer. In this way, p-type GaAs is present in the vicinity of the openings for contacting to the second confining layer. The regions between the elements of the array 11 are, however, of n-type conductivity thus blocking electrical current flow along the cap layer from one element of the array to another.

It is to be understood that the conductivity type of all the layers can be reversed so long as the relationships described above are maintained.

When liquid phase epitaxial growth techniques are used, the growth rate of individual layers will vary with the curvature of the surface upon which it is grown. The greater the amount of positive curvature of the surface, the faster the deposition. In this case, epitaxial growth will occur preferentially at the bottom of wells formed in the top surface of the buffer layer 26 above the groove 24. The growth of the portion of the top surface of the buffer layer 26 above the surface region 28 is reduced due to the surface's large negative curvature and lateral mass transfer of grown material towards the regions of the wells where the growth is enhanced. Thus, the first confinement layer above the surface regions 28 between the grooves 24 of each of the elements 11 has a relatively uniform thickness and tapers in increasing thickness in the direction perpendicular to the direction of the grooves. Similarly, the guide layer 32 and the active layer 34 have a portion of substantially uniform thickness in the region above the surface portion 28 between the grooves. The guide layer 32 tapers in increasing thickness as it extends towards the wells above the grooves 24. Preferably the taper is symmetric for each element of the array to insure a uniformity of coupling between the elements.

The electrically insulating layer 40 is preferably composed of silicon dioxide which is deposited on the cap layer 38 by pyrolytic decomposition of a silicon-containing gas, such as silane, in oxygen or water vapor. Openings are formed through the electrically insulating layer down to the cap layer above the surface regions 28 between the grooves of each element 11 of the array using standard photolithographic masking techniques and etching processes. A common metal electrical contact 42 is then deposited over the electrically insulating layer 40 and over the cap layer 38 where it is exposed through the electrically insulating layer. The electrical contact is preferably composed of titanium, platinum and gold sequentially evaporated onto the electrically insulating layer. An electrical contact 44 is deposited on the opposite surface 22 of the substrate 18 by sequential evaporation and sintering of tin and gold.

One of the opposed end faces 14 of the array is typically coated with a layer of $Al_2O_3$ or a similar material having a thickness of about one-half wave at the lasing wavelength. The opposed end face 14 may be coated with a mirror which is reflecting at the lasing wavelength. This mirror may consist of a layer of an electrical insulator such as $SiO_2$ coated with a layer of gold or, alternatively, the mirror may be a multilayer reflector such as that disclosed by Ettenberg in U.S. Pat. No. 4,092,659 issued May 30, 1978.

The particular combination of materials, such as GaAs and AlGaAs, is chosen such that they have an approximate lattice match to one another and provide differences in the index of refraction such that light generated in the active region will be guided as it propagates through the device. The active layer 34 is composed of a material having an index of refraction greater than that of the materials of each of the first and second confinement layers 30 and 36. The first and second confinement layers may be composed of materials having the same or differing indices of refraction. The guide layer 32 is composed of a material having an index of refraction less than that of the material of the active layer 34 but greater than that of the material of each of the first and second confinement layers 30 and 36. Thus, heterojunctions are formed between the first confinement layer 30 and the guide layer 32, between the guide layer 32 and the active layer 34 and between the active layer 34 and the second confinement layer 36.

On application of a voltage between the electrical contacts 42 and 44, electrical current will flow through the stripe openings in the electrically insulating layer 40 and across the junction region. If the current is greater than the threshold value, electrons and holes injected into the active region will recombine generating a laser light beam. Lasing occurs in the portion of the active region wich is directly over the surface region 28 between the grooves of an individual element 11 of the array. The ellipses drawn overlapping the active and guiding layers are indicative of the size of the lasing regions at the end face 14 of the device. Since the difference in the indices of refraction of the guide layer 32 and the active layer 34 is small, the light generated in the active layer spreads out into the guide layer 32. Light is then confined in the plane transverse to the plane of the p-n junction in the guide layer 32 and the active layer 34 by the heterojunctions between the confinement layer 30 and the guide layer 32 and between the active layer 34 and the second confinement layer 36.

The light will propagate in the active layer 34 and will obtain its optical gain from this layer and will also propagate in the guide layer 32 which is thicker than the active layer 34. Since the guide layer is transparent, little loss occurs to the light propagating in this layer as opposed to the active layer which is absorbing at the lasing wavelength. The width of the lasing region is controlled mainly by the guiding effect as well as the mode gain selectivity achieved by the guide layer 32 and, to some extent, by the active layer 34. If the active layer is too thin, then a higher order lasing mode is favored in the transverse direction. If the active region is too thick, then heating in this region occurs. Preferably a balance between the thicknesses of the active and guide layers and the index difference between these two layers is chosen such that the predominant portion of the light propagates in the guide layer but not so much as to raise the threshold of the laser.

Light generated in the active layer and propagating in the active and guide layers will contribute to the lasing beam for an individual element if it is propagating substantially parallel to the grooves. Light propagating at an angle to this direction is lost by radiation away from the lasing region in either the active or guide layers. This off-axis loss of radiation is the mechanism whereby a single mode output beam is obtained from an individual element of this structure. Light propagating away from the lasing region in the active layer is absorbed in a short distance. Since the guide layer is substantially transparent at the lasing wavelength, light propagating in this layer can travel large distances before it is lost by transmission through the end faces 14 or by absorption in the guide layer.

The light beam propagating in the guide layer is comprised of a single mode beam propagating in the lasing region substantially parallel to the grooves and off-axis components travelling at symmetric angles to this axis. The wave front of this mode is then composed of a central, plane wave portion and two symmetrical tail portions. For the structure described herein, the angle at which the tail portions travel is typically about 3 to 5 degrees.

In the multi-element device the tails of the mode from each element overlap and interact with corresponding modes from the adjacent elements. This interaction causes energy to flow from one element to another and an adjustment of the phase of the propagating modes of the individual elements such that they behave like a single coherent radiator.

In prior art structures, the interaction between the optical waves generated by the different elements of the array could only occur over a limited distance, typically 10 micrometers or less, because the off-axis tails were absorbed in the active layer or confined by gain guiding. This short interaction distance caused severe thermal problems which prevented continuous wave operation of the array. In the laser array of the invention, the coherent wave propagates in the transparent guide layer and thus the interaction between elements of the array can occur over longer distances typically up to 200 micrometers. This greatly enlarged spacing between the elements of the array permits sufficient thermal dissipation of the thermal power generated to permit continuous wave operation.

Although the laser array 10 has been shown and described as including dove-tail shaped grooves 24 in the top surface 20 of the substrate 18, which shape is preferred for ease of making the array 10, the grooves 24 can be of other shapes, such as V, U or square shape. No matter what shape grooves are used, the various layers of the array 10 should be deposited on the substrate so as to provide the guide layer 32 with portions which taper in directions away from the portion over the surface portion 28 of the top surface 20.

I claim:

1. A phase-locked semiconductor injection laser array comprising:
   a body of semiconductor material having a pair of spaced, parallel end surfaces which are reflective of light at the laser wavelength with at least one of the faces being partially transparent and including a substrate with a pair of opposed major surfaces with a plurality of separate pairs of spaced, substantially parallel grooves in a first major surface of the substrate and extending between the end faces;
   a first confinement epitaxial layer, overlying the surface of the substrate and the surfaces of the grooves;
   a guide epitaxial layer overlying the first confinement layer;
   an active epitaxial layer overlying the guide layer;
   a second confinement epitaxial layer overlying the active layer; and
   electrical contacts to the second confinement epitaxial layer and the second major surface of the substrate;
   wherein the body, the first confinement layer and the guide layer are of one conductivity type and the second confinement layer is of the opposite conductivity type; wherein the material of the active layer has an index of refraction greater than that of the materials of the first and second confinement layers and the material of the guide layer has an index of refraction less than that of the material of the active layer but greater than that of the material of each of the first and second confinement layers, and wherein the separate pairs of grooves are spaced an effective distance apart so that light generated in the active layer above a pair of grooves and propagating as a single optical mode in both the active and guide layers interacts with light generated above other pairs of grooves such that the optical modes are phase locked to one another.

2. A phase-locked semiconductor injection laser array comprising:
   a body of semiconductor material having a pair of spaced, parallel end surfaces which are reflective of light at the laser wavelength with at least one of the faces being partially transparent and including a substrate with a pair of opposed major surfaces with a plurality of separate pairs of spaced, substantially parallel, dove-tail shaped grooves in a first major surface of the substrate and extending between the end faces;
   a first confinement epitaxial layer, overlying the surface of the substrate and the surfaces of the grooves;
   a guide epitaxial layer overlying the first confinement layer;
   an active epitaxial layer overlying the guide layer;
   a second confinement epitaxial layer overlying the active layer; and
   electrical contacts to the second confinement epitaxial layer and the second major surface of the substrate;
   wherein the body, the first confinement layer and the guide layer of one conductivity type and the second confinement layer is of the opposite conductivity type; wherein the material of the active layer has an index of refraction greater than that of the materials of the first and second confinement layers and the material of the guide layer has an index of refraction less than that of the material of the active layer but greater than that of the material of each of the first and second confinement layers, and wherein the separate pairs of grooves are spaced an effective distance apart so that light generated in the active layer above a pair of grooves and propagating as a single optical mode in both the active and guide layers interacts with light generated above other pairs of grooves such that the optical modes are phase locked to one another.

3. A semiconductor injection laser array in accordance with claim 1 or 2 in which a buffer layer composed of the same material and having the same conductivity type as that of the substrate is interposed between the substrate and the first confinement layer.

4. A semiconductor laser array in accordance with claim 3 in which the guide layer has a portion which tapers in increasing thickness away from that portion of the guide layer which is over the surface portion of the substrate between the grooves of a pair.

5. A semiconductor laser array in accordance with claim 1 or 2 further comprising a cap epitaxial layer overlying the second confinement layer and of the same conductivity type as the second confinement layer.

6. A semiconductor laser array according to claim 1 or 2 further comprising an electrically insulating layer overlying the cap layer wherein the insulating layer has openings therethrough extending down to the cap layer over the portion of the substrate between each pair of grooves and electrical contacts to the cap layer in the openings.

7. A semiconductor injection laser array according to claim 6 further comprising an electrically conducting layer overlying the electrically insulating layer and the portion of the cap layer exposed through the openings in the electrically insulating layer and further comprising an electrically conducting layer overlying the surface of the substrate opposed to the surface containing the grooves.

8. A semiconductor laser array according to claim 1 or 2 wherein the spacing of a pair of grooves is between about 20 and about 40 micrometers.

9. A semiconductor laser array according to claim 1 or 2 wherein the center-to-center spacing between pairs of grooves is greater than the spacing between the grooves of a pair.

10. A semiconductor laser array according to claim 9 wherein the center-to-center spacing between pairs of grooves is between about 20 and 200 micrometers.

11. A semiconductor laser array according to claim 9 wherein the center-to-center spacing between pairs of grooves is between about 50 and 100 micrometers.

* * * * *